March 1, 1966 C. S. AITCHISON 3,238,467

DIODE PARAMETRIC AMPLIFIER WITH LUMPED CONSTANT SIGNAL RESONANT CIRCUIT IN BROADBAND IDLER RESONANT CIRCUIT

Filed Nov. 20, 1963

INVENTOR.
COLIN S. AITCHISON
BY
Frank R. Trifari
AGENT 3,238,467

DIODE PARAMETRIC AMPLIFIER WITH LUMPED CONSTANT SIGNAL RESONANT CIRCUIT IN BROADBAND IDLER RESONANT CIRCUIT

Colin Stuart Aitchison, Horley, England, assignor to North American Philips Company, Inc., New York, N.Y., a corporation of Delaware Filed Nov. 20, 1963, Ser. No. 325,038

Claims priority, application Great Britain, Nov. 26, 1962, 44,630/62

5 Claims. (Cl. 330—4.9)

This invention relates to a parametric system having a non-linear element in the form of a voltage-dependent diode which in operation is so biased as to act as a capacitor. Such use of a diode as a voltage-dependent capacitor is known.

In microwave parametric amplifiers as hitherto proposed a common disadvantage has been that the resonant circuit of the device at the signal frequency is in distributed form. In other words, the resonant circuit was a tunable length of transmission line, such as a waveguide. A transmission line is, in effect, a resonant circuit comprising distributed components. The use of such a resonant circuit comprising distributed components introduces the disadvantage that the Q is high and the band width consequently is small.

The present invention provides an improved arrangement wherein the disadvantage of small bandwidth at the signal-frequency resulting from the use of a distributed-constant circuit is avoided by the use of a lumped-constant circuit.

According to the present invention a diode parametric system comprises a length of waveguide having a first portion tunable by a short-circuiting piston to resonance at an idler frequency and a second portion of higher cut-off frequency. An input port is provided for introducing pump energy into the second portion. A voltage-dependent diode capacitor is mounted within the waveguide at or adjacent the junction of the two said portions, and is connected to the wall of the waveguide. A signal port is provided adjacent the junction for introducing into or withdrawing from the waveguide energy at a signal frequency lower than the idler frequency. An adjustable capacitive probe is also provided extending towards the free end of the diode from an adjacent wall of the waveguide to form, in combination with the self-capacitance and self-inductance of the diode, a variable-frequency tuned lumped circuit resonant at the signal frequency.

The system may comprise an inductor positioned close to and connected in parallel with the diode so as to increase the total inductance of the signal-frequency resonant circuit.

One embodiment of the invention will now be described, by way of example, with reference to the accompanying diagrammatic drawings, wherein.

Referring to the figures a diode parametric amplifier device is arranged to operate at an idler frequency higher than the input signal frequency, and with a pump frequency equal to the sum of the signal and idler frequencies. Typical frequency relationships would be a signal in the 3 gc./s. band, a source of pump energy in the 8 gc./s. band and an idler frequency in the 5 gc./s. band. The device comprises a length of waveguide A. One end of waveguide A is terminated in a short-circuiting piston B. A length F of coaxial line forms a junction with the waveguide A. The centre conductor N of the line F extends into the waveguide to form a probe. The second coaxial line E also extends into the waveguide through one of the narrow walls thereof, and the centre conductor of line E terminates within the waveguide as a probe M. At the location in the waveguide of the probes M and N a diode D is disposed. One terminal of the diode is connected to a wide wall of the waveguide, and the diode is suitably biased to a non-conducting condition by means not shown.

The diode D acts, in a known manner, as a voltage-dependent capacitor and, together with a small inductor H which is connected in parallel with this diode, forms a parallel-resonant circuit at the signal-frequency of the apparatus. The dimensions of the inductor E will of course depend upon the signal-frequency at which the apparatus. The dimensions of the inductor H will of may be found that the self-inductance of the diode itself is sufficient and consequently the inductor H would then be omitted. In this case of course a suitable D.C. return path must be provided for completing the bias circuit of the diode.

Figure 1:
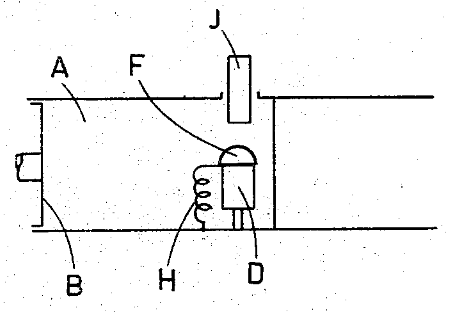
FIGURE 1 is a side view of a diode parametric amplifier according to the invention.
Figure 2:
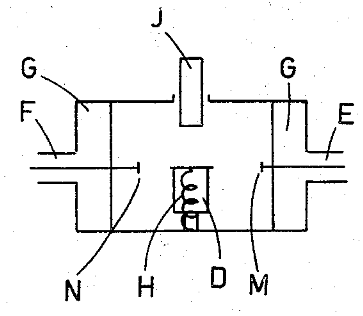
FIGURE 2 is a section of the amplifier of FIG. 1.
Figure 3:
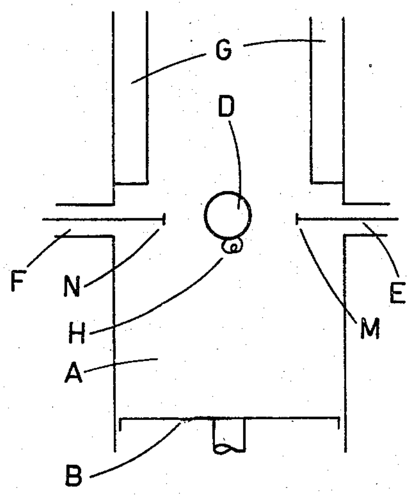
FIGURE 3 is a plan view of the amplifier of FIG. 1.

The waveguide A comprises two portions. The portion extending between the piston B to a short distance past the junctions of the waveguide and the coaxial lines is tuned by the piston B to resonance at the idler frequency which, in this device, is higher than the signal frequency. The second portion of the waveguide is defined by side members G which are inserted into the waveguide A and have the effect of increasing the cut-off frequency to above the signal and idler frequencies by forming a waveguide section of effectively smaller cross-section. Although not essential, it is preferable for this portion of the waveguide to be tunable, by means not shown in FIGURES 1 to 3, to resonance at the pump frequency and this portion will also be provided with input means, also not shown in FIGURES 1 to 3, for introducing pump energy into the waveguide.

In the embodiment of the invention illustrated in the drawing, two ports are provided in the waveguide A for coupling energy at the signal frequency. For instance, if line F is used as a signal-input line, then line E can be used as a signal-output line. It is however not essential that two signal-frequency ports be provided since a single port positioned in a narrow wall of the waveguide may be used if convenient and where a circulator is provided to separate the input and output signals. The probes M and N extend into the waveguide from narrow walls and are parallel to the wide walls of the waveguide, so as to be loosely coupled to a TE waveguide mode. Where two ports are provided the output port may, if desired, be arranged to extract energy at the idler frequency instead of at the signal frequency so that with the frequency relationships exemplified above the device would then function as an up-converter.

An adjustable capacitive probe J is movable in and out of a wide wall of the waveguide, adjacent diode D, so as to vary the total capacitance of the signal-frequency tuned circuit HD and thereby provide means for adjusting the tuning of that circuit.

Figure 4:
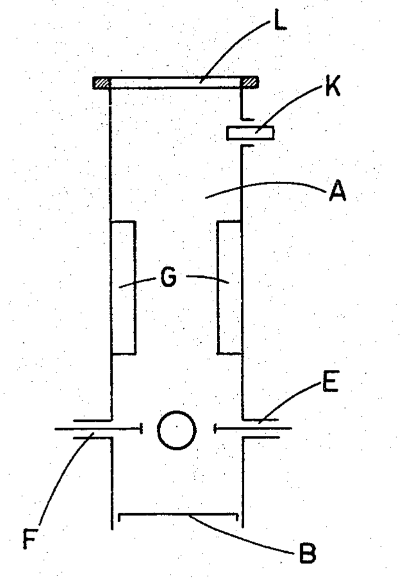
FIGURE 4 is a further plan view of an amplifier according to the invention.

One method of terminating the waveguide A is illustrated in FIGURE 4. In this arrangement the end of the waveguide remote from the piston B is formed with a flange L for coupling to a pump source: alternatively of course the waveguide could be terminated in a closed end and pump energy could be introduced through a suitable port. It will be observed that the side members G need not extend all the way to this end of the waveguide since their function is to provide a section of guide having a higher cut-off frequency than the signal and idler frequencies, and if they are long enough to present a sufficiently high impedance at each of these two frequencies it is usually mechanically preferable to revert to standard dimensions of waveguide beyond these members. The whole of the waveguide A is tuned to resonance at the pump frequency by an adjustable probe K.

With this arrangement it has been found that because the cut-off frequency of the section of the waveguide defined by the side members G is higher than the signal and idler frequencies, the pump tuning has very little, if any, effect upon the idler-frequency tuning or upon the signal frequency tuning. Also, because the signal-frequency circuit is a lumped-constant circuit, variation of the idler-frequency tuning piston B has little or no effect upon the tuning of the signal-frequency circuit.

What is claimed is:

1. A diode parametric amplifier comprising a conductive housing having first and second adjacent regions, a source of signals, a source of pump oscillations having a frequency higher than the frequency of said signals whereby the difference frequency of said pump and signal frequencies is between said pump and signal frequencies, at least part of said second region having smaller cross-sectional dimensions than said first region whereby said first region cannot support oscillations of said difference frequency, means for tuning said first region to said difference frequency, means for applying said pump oscillations to said second region, signal input and signal output means coupled to said first region, voltage-dependent diode capacitor means positioned within said first region and having one electrode connected to a wall thereof, and capacitor probe means in said first region connected to a wall thereof and spaced from the other electrode of said diode capacitor means, said diode capacitor means and capacitor probe means comprising a lumped-constant resonant circuit tuned to said signal frequency.

2. A diode parametric amplifier comprising a waveguide section, a source of signals, a source of pump oscillations of a frequency higher than the frequency of said signals, means for tuning one end portion of said waveguide section to an idler frequency comprising short circuiting piston means in said one end portion, the other adjacent end portion of said waveguide means having a cutoff frequency between said idler and pump frequencies, means for applying said signals to said first end portion, means for applying said pump oscillations to said second end portion, voltage-dependent diode capacitor means positioned within said first portion near said second portion and having one electrode connected to a wall of said first portion, and capacitor probe means within said first portion connected to a wall thereof and extending toward the other electrode of said diode capacitor means, whereby said diode capacitor means and capacitor probe means comprise a lumped-constant resonant circuit tuned to said signal frequency.

3. The amplifier of claim 2, comprising inductor means connected in parallel with said diode capacitor means, said inductor means forming part of said lumped-constant resonant circuit.

4. A diode parametric amplifier comprising a waveguide section having a rectangular cross-section with adjacent wide and narrow walls, a source of signals, a source of pump oscillations having a frequency higher than the frequency of said signals, short circuiting piston means in a first portion of said waveguide section for tuning said one end portion to an idler frequency between said signal and pump frequencies, said waveguide section having a second portion adjacent said first portion, said second portion having a cutoff frequency between said idler and pump frequencies, means for applying said pump oscillations to said second portion, a signal inlet port in a narrow wall of said first portion near the junction of said first and second portions, means for applying signals to said inlet port, voltage-dependent diode capacitor means within said first portion near said junction, means connecting one electrode of said diode capacitor means to one wide wall of said first portion, and capacitive probe means extending in said first portion from the other wide wall thereof toward the other electrode of said diode capacitor means, whereby a lumped-constant resonant circuit tuned to said signal frequency is comprised by the self-inductance and capacitance of said diode capacitor means and the capacitance between said probe means and the other electrode of said diode capacitor means.

5. The amplifier of claim 4, comprising a signal output port in the other narrow wall of said first portion.

References Cited by the Examiner

UNITED STATES PATENTS

| | | | |
|---|---|---|---|
| 3,040,267 | 6/1962 | Seidel | 330—4.9 |
| 3,119,073 | 1/1964 | Harris | 330—4.9 |

FOREIGN PATENTS

| | | |
|---|---|---|
| 901,905 | 7/1962 | Great Britain. |

ROY LAKE, *Primary Examiner.*